(12) United States Patent
Sanmiya et al.

(10) Patent No.: US 7,521,689 B2
(45) Date of Patent: Apr. 21, 2009

(54) DEFLECTOR FOR EQUIPMENT OF ELECTRON BEAM LITHOGRAPHY AND EQUIPMENT OF ELECTRON BEAM LITHOGRAPHY

(75) Inventors: Yoshimasa Sanmiya, Numazu (JP); Kenji Ohtoshi, Kawasaki (JP); Tetsuro Nishiyama, Numazu (JP)

(73) Assignee: NuFlare Technology, Inc., Numazu-shi (JP)

( * ) Notice: Subject to any disclaimer, the term of this patent is extended or adjusted under 35 U.S.C. 154(b) by 255 days.

(21) Appl. No.: 11/671,152

(22) Filed: Feb. 5, 2007

(65) Prior Publication Data

US 2007/0181819 A1 Aug. 9, 2007

(30) Foreign Application Priority Data

Feb. 9, 2006 (JP) ............................. 2006-032660

(51) Int. Cl.
*H01J 37/30* (2006.01)
(52) U.S. Cl. ................................. 250/396 R; 250/492.2
(58) Field of Classification Search ............. 250/396 R, 250/492.2
See application file for complete search history.

(56) References Cited

U.S. PATENT DOCUMENTS

| 5,214,289 | A | * | 5/1993 | Betsui | ..................... 250/396 R |
| 5,245,194 | A | | 9/1993 | Oae et al. | |
| 7,109,494 | B2 | * | 9/2006 | Ono et al. | ............... 250/396 R |
| 7,276,707 | B2 | * | 10/2007 | Iwasaki et al. | ........... 250/396 R |

FOREIGN PATENT DOCUMENTS

JP 2002-198294 7/2002

* cited by examiner

*Primary Examiner*—Kiet T Nguyen
(74) *Attorney, Agent, or Firm*—Oblon, Spivak, McClelland, Maier & Neustadt, P.C.

(57) ABSTRACT

A deflector for an equipment of electron beam lithography, the deflector including a plurality of control electrodes arranged symmetrically relative to the center axis of an irradiated electron beam, the electrodes configured to control the electron beam by applying voltages respectively, a plurality of molding substrates arranged symmetrically relative to the center axis of the electron beam configured to face outer peripheral surfaces of the plurality of control electrodes and a plurality of earth electrodes arranged respectively at the plurality of molding substrates. The deflector can suppress generation of cross talks with an improved accuracy of controlling an electron beam.

18 Claims, 3 Drawing Sheets

DEFLECTOR FOR EQUIPMENT OF ELECTRON BEAM LITHOGRAPHY AND EQUIPMENT OF ELECTRON BEAM LITHOGRAPHY

CROSS-REFERENCE TO RELATED APPLICATIONS

This application is based upon and claims the benefit of priority from the prior Japanese Patent Application No. 2006-32660 filed on Feb. 9, 2006, the entire contents of which are incorporated herein by reference.

BACKGROUND OF THE INVENTION

1. Field of the Invention

This invention relates to a deflector to be used to control the electron beam typically for writing a pattern of semiconductor devices and also to an equipment of electron beam lithography including such a deflector.

2. Description of the Related Art

An elevated accuracy level is required for mask processing in response to shrinking of semiconductor devices in recent years. An equipment of electron beam lithography is currently available to be possible highly accurately masks processing. Such equipment of electron beam lithography are adapted to control an electron beam so as to make it accurately strike a desired spot. An electrostatic deflector is typically used for controlling an electron beam.

In the electrostatic deflector, a plurality of individually insulated trapezoidal bulk electrodes are arranged symmetrically relative to the center axis of the irradiated electron beam and the electron beam is controlled for its position and other factors by subjecting each of the electrodes to predetermined potential changes.

When a deflection potential is applied to a predetermined electrode, a micro potential is generated in the adjacent electrodes to which no deflection potential is applied to give rise to a problem of a cross talk. Jpn. Pat. Appln. Laid-Open Publication No. 2002-198294 and other patent documents propose techniques of arranging an earth electrode between adjacent electrodes. However, the cross talk appears not only between electrodes but also in other areas and it is not satisfactory to control potential between adjacent electrodes.

On the other hand, a signal wire for supplying a deflection potential and an earth wire are connected to each electrode. Normally, the earth wire is drawing to the outer peripheral side of the electrode and the route of the earth wire is not particularly fixed. However, since the impedance of the electrode varies as a function of the route of the earth wire, the deflection potential can fluctuate to degrade the accuracy of controlling the electron beam.

SUMMARY OF THE INVENTION

An object of the present invention is to provide a deflector for an equipment of electron beam lithography that can suppress generation of cross talks and improve the accuracy of controlling an electron beam.

In an aspect of the present invention, there is provided a deflector for an equipment of electron beam lithography, including a plurality of control electrodes arranged symmetrically relative to the center axis of an irradiated electron beam, the electrodes configured to control the electron beam by applying voltages respectively, a plurality of molding substrates arranged symmetrically relative to the center axis of the electron beam configured to face outer peripheral surfaces of the plurality of control electrodes and a plurality of earth electrodes arranged respectively at the plurality of molding substrates.

In other aspect of the present invention, there is provided an equipment of electron beam lithography, including an electron gun configured to irradiate an electron beam, a stage configured to attach a mask, and a deflector installed between the electron gun and the stage configured to control the electron beam irradiated from the electron gun for mask processing, having a plurality of control electrodes arranged symmetrically relative to the center axis of the electron beam, the electrodes configured to control the electron beam by applying voltages respectively, having a plurality of molding substrates arranged symmetrically relative to the center axis of the electron beam configured to face outer peripheral surfaces of the plurality of control electrodes; and having earth electrodes arranged respectively at the plurality of molding substrates.

In other aspect of the present invention, there is provided a deflector for an equipment of electron beam lithography, including a plurality of control electrodes arranged symmetrically relative to a center axis of an irradiated electron beam configured to control the electron beam by applying voltages respectively and an integrally formed earth electrode arranged in the outer peripheral region of the plurality of control electrodes and between the adjacent control electrodes.

In other aspect of the present invention, there is provided an equipment of electron beam lithography including an electron gun configured to irradiate an electron beam, a stage configured to attach a mask and a deflector installed between the electron gun and the stage configured to control the electron beam irradiated from the electron gun for mask processing, having a plurality of control electrodes arranged symmetrically relative to a center axis of an irradiated electron beam configured to control the electron beam by applying voltages respectively and having an integrally formed earth electrode arranged in the outer peripheral region of the plurality of control electrodes and between the adjacent control electrodes.

BRIEF DESCRIPTION OF THE DRAWINGS

The accompanying drawings, which are incorporated in and constitute a part of the specification, illustrate embodiments of the invention and, together with the general description given above and the detailed description of the embodiments given below, serve to explain the principles of the invention.

DETAILED DESCRIPTION OF THE PREFERRED EMBODIMENTS

Hereinafter, the embodiments relating to the present invention will be explained with reference to the accompanying drawings.

Embodiment 1

Figure 1:
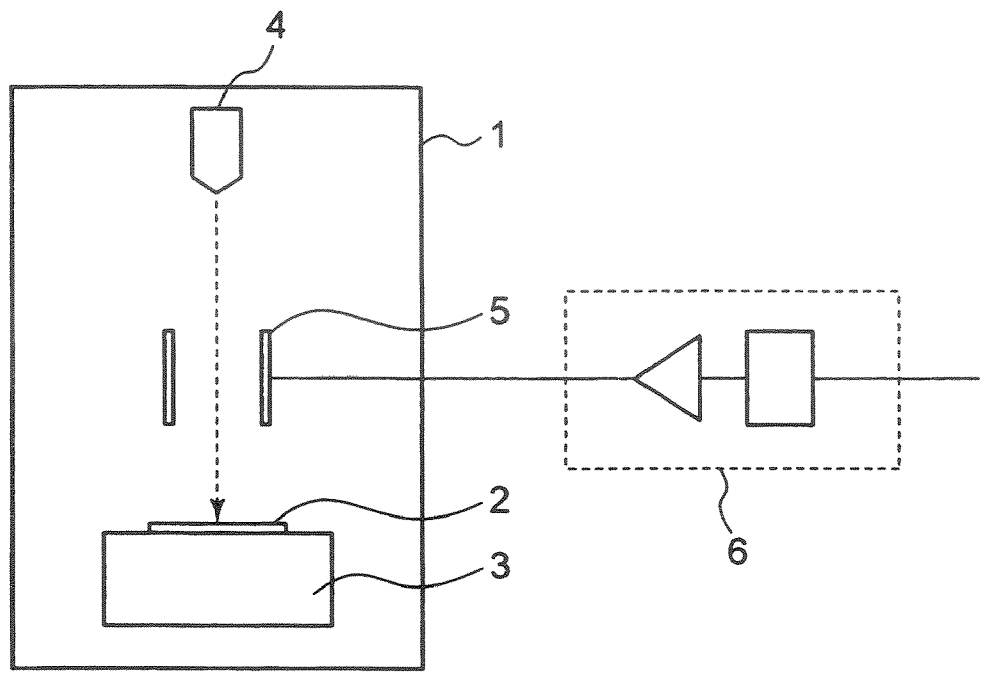
FIG. 1 is a schematic conceptual illustration of an equipment of electron beam lithography to which an embodiment of deflector for an equipment of electron beam lithography according to the present invention is applied.

FIG. 1 is a schematic conceptual illustration of an equipment of electron beam lithography to which this embodiment of deflector for an equipment of electron beam lithography according to the present invention is applied. Referring to FIG. 1, a deflector 5 for controlling the position of an electron beam is arranged between a stage 3 carrying a mask 2 mounted thereon and an electron gun 4 for irradiating an electron beam toward the mask 2 in a column 1. Each deflector 5 is connected to a control circuit 6 individually to control the deflector.

Figure 2:
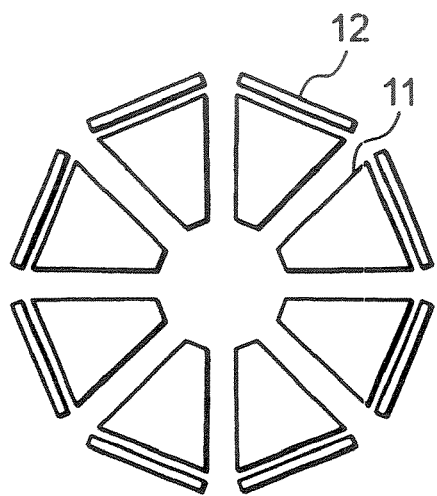
FIG. 2 is a schematic top view of equipment of electron beam lithography according to the embodiment of the present invention.
Figure 3:
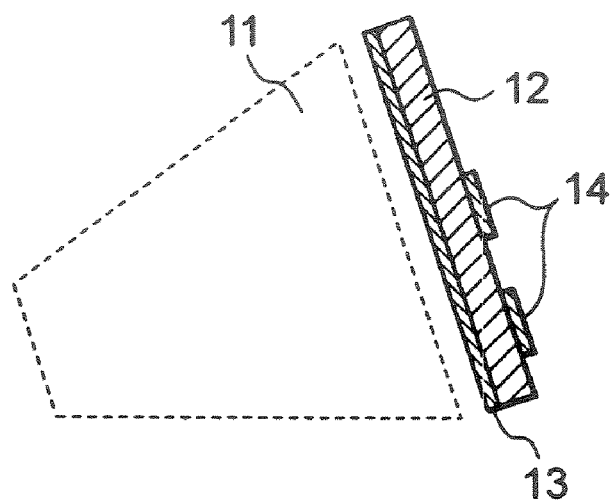
FIG. 3 is a schematic illustration of the structure of the molding substrate according to the embodiment of the present invention.

FIG. 2 is a schematic top view of the deflector that is used for such the equipment of electron beam lithography. As shown in FIG. 2, a total of eight bulk electrodes 11 electrically isolated each other are arranged symmetrically relative to the center axis of the electron beam to be irradiated. Each of the bulk electrodes 11 is a trapezoidal prizm. Molding substrates 12 such as typically flexible printed circuit boards, are arranged along the outer peripheral surfaces of the respective electrodes with a predetermined gap respectively. As shown in FIG. 3, an earth wire 13 is formed on the surface of the molding substrates 12 that faces the electrode 11, while signal wires 14 are formed on the opposite surface thereof.

Using the deflector for the equipment of electron beam lithography having such a configuration, it is possible to control the electron beam so as to strike the mask on the stage at a predetermined position and shape by irradiating an electron beam toward the mask on the stage from the electron gun with a predetermined potential change from the signal wires 14 connected to the control circuit to each of the electrodes 11. Since each of the earth wires 13 is fixed close to the corresponding electrode 11, its impedance is controlled to a constant value so that it is possible to highly accurately control the electron beam and suppress generation of cross talks.

Embodiment 2

The deflector for the equipment of electron beam lithography in this embodiment is similar in configuration of the electrodes of Embodiment 1, it differs from Embodiment 1 in terms of the structure of the molding substrates arranged at the side of the outer peripheral surfaces of the electrodes.

Figure 4:
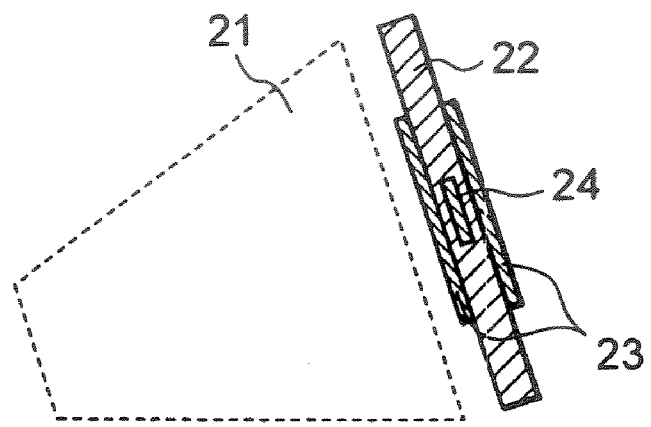
FIG. 4 is a schematic illustration of the structure of the molding substrate according to the embodiment of the present invention.

As shown in FIG. 4, two earth wires 23 are formed respectively on the surface of the molding substrate 22 at the side of the outer peripheral surface of the electrode 21 and on the other surface thereof, while a signal wire 24 is formed in the inside of the molding substrate 22.

Using the deflector for the equipment of electron beam lithography having such a configuration, it is possible to control the electron beam so as to strike the mask on the stage at a predetermined position and shape by irradiating an electron beam toward the mask on the stage from the electron gun with a predetermined potential change from the signal wires 24 connected to the control circuit to each of the electrodes 21 like as Embodiment 1. Since each of the earth wires 23 is fixed close to the corresponding electrode 21, its impedance is controlled to a constant value so that it is possible to highly accurately control the electron beam and suppress generation of cross talks like as Embodiment 1.

The electrodes are electrically isolated from each other with predetermined gaps in Embodiments 1 and 2, it is possible to suppress generation of cross talks more effectively by inserting an earth electrode between adjacently arranged electrodes.

Embodiment 3

Figure 5:
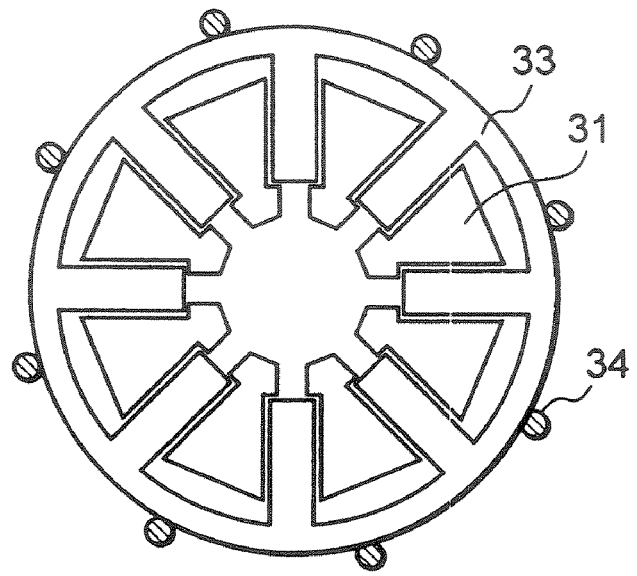
FIG. 5 is a schematic top view of the deflector for an equipment of electron beam lithography according to the embodiment of the present invention.

FIG. 5 shows this embodiment of deflector for the equipment of electron beam lithography. As shown in FIG. 5, eight bulk electrodes 31 are arranged symmetrically relative to the center axis of the electron beam to be irradiated. Each of the bulk electrodes 31 are shaped the trapezoidal prism like Embodiments 1 and 2, partly cutting out from the outer peripheral side to broaden the gap between the adjacent electrodes of the outer peripheral side than that of the center axis side. An integrally formed earth wire 33 is arranged along the outer peripheries and in the broadened parts at the outer peripheral sides of the gaps. Signal wires 34 are arranged along the outer periphery of the earth wire 33.

Using the deflector for the equipment of electron beam lithography having such a configuration, it is possible to control the electron beam so as to strike the mask on the stage at a predetermined position and shape by irradiating an electron beam toward the mask on the stage from the electron gun with a predetermined potential change from the signal wires 34 connected to the control circuit to each of the electrodes 31 like as Embodiment 1 Since each of the earth wires 33 is fixed close to the corresponding electrode 31, its impedance is controlled to a constant value so that it is possible to highly accurately control the electron beam and suppress generation of cross talks like as Embodiment 1.

Figure 6:
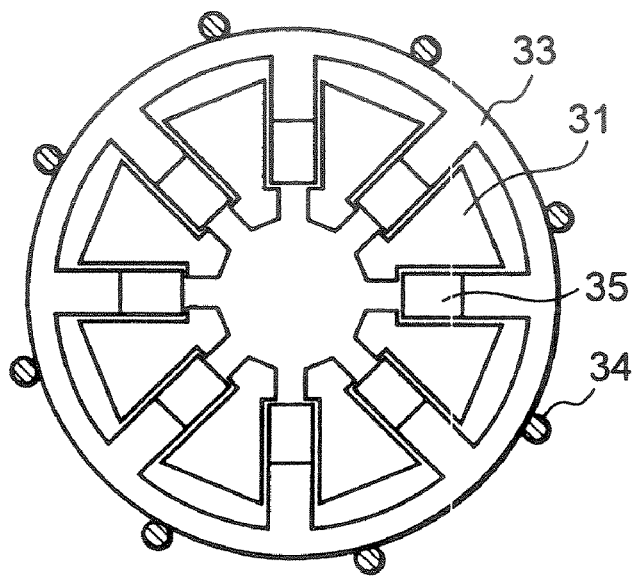
FIG. 6 is a schematic top view of the deflector for an equipment of electron beam lithography according to the embodiment of the present invention.

While an integrally formed earth wire is arranged along the outer peripheries and in the broadened parts at the outer peripheral sides of the gaps in this embodiment, it may be provided with insulating sections 35 made of an insulating material such as ceramic at respective parts thereof extending toward the center axis as shown in FIG. 6.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the generative inventive concept as defined by the appended claims and their equivalents.

What is claimed is:

1. A deflector for an equipment of electron beam lithography, the deflector comprising:
    a plurality of control electrodes arranged symmetrically relative to a center axis of an irradiated electron beam, the electrodes configured to control the electron beam by applying voltages respectively;
    a plurality of molding substrates arranged symmetrically relative to the center axis of the electron beam configured to face outer peripheral surfaces of the plurality of control electrodes; and
    a plurality of earth electrodes arranged respectively at the plurality of molding substrates.

2. The deflector according to claim 1, wherein each of the earth electrodes is formed on the surface of each of the molding substrates, facing to each of the control electrodes.

3. The deflector according to claim 1, further comprising a signal wire arranged on each of the molding substrates configured to supply a control signal to each of the control electrodes.

4. The deflector according to claim 3, wherein the signal wire is arranged on opposite side of the surface of each of the molding substrates, the surface facing to each of the control electrodes.

5. The deflector according to claim 3, wherein the signal wire is arranged in the inside of each of the molding substrates.

6. The deflector according to claim 1, wherein each of the molding substrates is a flexible printed circuit board.

7. The deflector according to claim 1, wherein each of the control electrodes has a trapezoidal prism shape.

8. A deflector for an equipment of electron beam lithography, the deflector comprising:
   a plurality of control electrodes arranged symmetrically relative to a center axis of an irradiated electron beam configured to control the electron beam by applying voltages respectively; and
   an integrally formed earth electrode arranged in the outer peripheral region of the plurality of control electrodes and between the adjacent control electrodes.

9. The deflector according to claim 8, wherein each of the control electrodes is a trapezoidal prism shape cutting out from the outer peripheral side partly.

10. An equipment of electron beam lithography, the equipment comprising:
    an electron gun configured to irradiate an electron beam;
    a stage configured to attach a mask; and
    a deflector installed between the electron gun and the stage configured to control the electron beam irradiated from the electron gun for mask processing, having a plurality of control electrodes arranged symmetrically relative to a center axis of the electron beam, the electrodes configured to control the electron beam by applying voltages respectively, having a plurality of molding substrates arranged symmetrically relative to the center axis of the electron beam configured to face outer peripheral surfaces of the plurality of control electrodes; and having earth electrodes arranged respectively at the plurality of molding substrates.

11. The equipment according to claim 10, wherein each of the earth electrodes is formed on the surface of each of the molding substrate, facing to the each of control electrode.

12. The equipment according to claim 10, further comprising a signal wire arranged on each of the molding substrates configured to supply a control signal to each of the control electrodes.

13. The equipment according to claim 12, wherein the signal wire is arranged on opposite side of the surface of each of the molding substrates, the surface facing to each of the control electrodes.

14. The equipment according to claim 12, wherein the signal wire is arranged in the inside of each of the molding substrates.

15. The equipment according to claim 10, wherein each of the molding substrates is a flexible printed circuit board.

16. The equipment according to claim 10, wherein each of the control electrodes has a trapezoidal prism shape.

17. An equipment of electron beam lithography, the equipment comprising:
    an electron gun configured to irradiate an electron beam;
    a stage configured to attach a mask; and
    a deflector installed between the electron gun and the stage configured to control the electron beam irradiated from the electron gun for mask processing, having a plurality of control electrodes arranged symmetrically relative to a center axis of an irradiated electron beam configured to control the electron beam by applying voltages respectively and having an integrally formed earth electrode arranged in the outer peripheral region of the plurality of control electrodes and between the adjacent control electrodes.

18. The equipment according to claim 17, wherein each of the control electrodes is a trapezoidal prism shape cutting out from the outer peripheral side partly.

* * * * *